(12) United States Patent
Kientz

(10) Patent No.: US 11,886,712 B2
(45) Date of Patent: Jan. 30, 2024

(54) DIE FAMILY MANAGEMENT ON A MEMORY DEVICE USING BLOCK FAMILY ERROR AVOIDANCE

(71) Applicant: MICRON TECHNOLOGY, INC., Boise, ID (US)

(72) Inventor: Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 17/856,771

(22) Filed: Jul. 1, 2022

(65) Prior Publication Data
US 2023/0393745 A1 Dec. 7, 2023

Related U.S. Application Data

(60) Provisional application No. 63/347,918, filed on Jun. 1, 2022.

(51) Int. Cl.
*G06F 3/06* (2006.01)
(52) U.S. Cl.
CPC .......... *G06F 3/0611* (2013.01); *G06F 3/0653* (2013.01); *G06F 3/0679* (2013.01)
(58) Field of Classification Search
CPC ..... G06F 3/0611; G06F 3/0653; G06F 3/0679
USPC .......................................... 711/154
See application file for complete search history.

(56) References Cited

U.S. PATENT DOCUMENTS

| | | | |
|---|---|---|---|
| 2014/0201580 A1* | 7/2014 | Desireddi | G06F 12/0246 714/721 |
| 2014/0226398 A1* | 8/2014 | Desireddi | G11C 16/349 365/185.03 |
| 2019/0146689 A1* | 5/2019 | Zhou | G11C 16/3418 711/103 |
| 2022/0057935 A1* | 2/2022 | Sheperek | G11C 11/5642 |
| 2022/0084605 A1* | 3/2022 | Muchherla | G11C 29/028 |

* cited by examiner

*Primary Examiner* — Than Nguyen
(74) *Attorney, Agent, or Firm* — Lowenstein Sandler LLP

(57) ABSTRACT

A target block family of a plurality of block families is identified periodically every predetermined number of program erase cycles (PECs) of a memory device. Each block family includes a plurality of blocks. A respective temporal voltage shift of each block of a subset of blocks of the target block family from each die of a plurality of dies associated with the target block family is obtained. A respective die measurement for each respective die is obtained based on an average of the respective temporal voltage shifts of the subset of blocks from each die. Each respective die to a respective die family of a plurality of consecutive die families is assigned based on the respective die measurement for each respective die.

20 Claims, 9 Drawing Sheets

| Die #
610 | Die Family #
620 |
|---|---|
| Die 0 | |
| Die 1 | |
| Die 2 | |
| Die 3 | |
| Die 4 | |
| ... | |
| Die N | |

FIG. 6

DIE FAMILY MANAGEMENT ON A MEMORY DEVICE USING BLOCK FAMILY ERROR AVOIDANCE

RELATED APPLICATIONS

This application claims the benefit of U.S. Provisional Patent Application No. 63/347,918, filed Jun. 1, 2022, the entirety of which is incorporated herein by reference.

TECHNICAL FIELD

Embodiments of the disclosure relate generally to memory sub-systems, and more specifically, relate to die family management on a memory device using block family error avoidance.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 6 illustrates an example table maintained by the memory sub-system controller for die family management on a memory device using block family error avoidance, in accordance with embodiments of the present disclosure.

DETAILED DESCRIPTION

Figure 1:
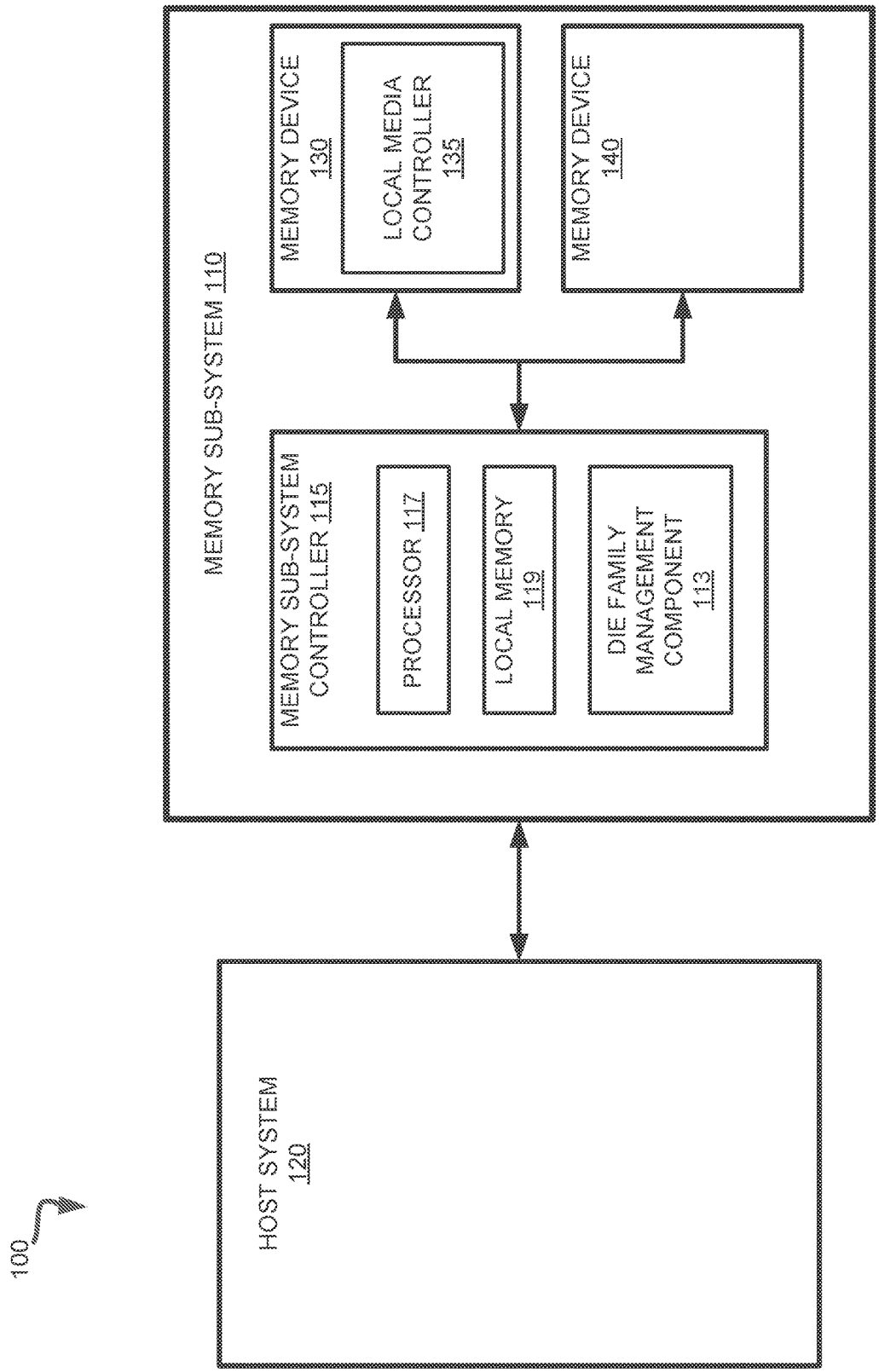
FIG. 1 illustrates an example computing system that includes a memory sub-system in accordance with some embodiments of the present disclosure.

Aspects of the present disclosure are directed to die family management on a memory device using block family error avoidance. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes, such that each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells. Depending on the cell type, each memory cell can store one or more bits of binary information, and has various logic states that correlate to the number of bits being stored. The logic states can be represented by binary values, such as "0" and "1", or combinations of such values. A set of memory cells referred to as a memory page can be programmed together in a single operation, e.g., by selecting consecutive bitlines.

Data operations can be performed by the memory sub-system. The data operations can be host-initiated operations. For example, the host system can initiate a data operation (e.g., write, read, erase, etc.) on a memory sub-system. The host system can send access requests (e.g., write command or read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with 2 n different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss (SCL), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in an increased bit error rate in read operations.

Some memory sub-systems mitigate the temporal voltage shift by employing block family based error avoidance strategies. The temporal voltage shift is selectively tracked for programmed blocks grouped by block families, and appropriate voltage offsets, which are based on block affiliation with a certain block family, are applied to the base read levels in order to perform read operations. A "block family" herein shall refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. The "base read level" herein shall refer to the initial threshold voltage level exhibited by the memory cell immediately after programming. In some implementations, base read levels can be stored in the metadata of the memory device.

The temporal voltage shift may be measured by determining a difference between the base read levels of the memory cell and a current read level obtained by performing a continuous read level calibration (cRLC) operation on the memory cell. The cRLC operation continuously samples valleys of programming distributions (also referred to as Vt distribution valleys) associated with each read level threshold of the memory cells. Accordingly, the temporal voltage shift may be determined based on the difference between the base read levels and the Vt distributions valleys associated with each read level.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process (also referred to as a calibration scan) in order to evaluate a data state metric (e.g., a bit error rate) and associate each die of every block family with one of predefined threshold voltage offset bins (referred to as bins), which is in turn associated with the voltage offset to be applied for read operations. The bins can be numbered from 0 to 7 (e.g., bin 0-bin 7), and each bin can be associated with a voltage offset to be applied to a base read level for read operations. The associations of each die of each block family with bins (e.g., bins 0-7) can be stored in respective metadata tables maintained by the memory sub-system controller. However, performing the calibration scan on each die of the plurality of dies can be time consuming.

Some memory sub-systems may group dies into die families based on dies having similar SCL characteristics. Thus, some memory sub-systems may perform a calibration scan on a target die from a die family to evaluate a data state metric and re-associate each die of the die family based on the target die to a bin. However, as each die of the memory device encounters program erase cycles (PECs), over time the SCL characteristics of each die may change causing further calibration scans of a target die of a die family to inaccurately associate each die of the die family to a bin. Some memory sub-systems may regroup the die families by performing calibration scans on various block families in a bin for every die of the plurality of dies. However, performing the calibration scan on various block families in a bin for every die of the plurality of dies to regroup the die families can be time consuming and contribute to increased latency in performing memory access operations on the memory device.

Aspects of the present disclosure address the above and other deficiencies by performing a calibration scan on a subset of blocks of an individual block family for every die of the plurality of dies. An average of each temporal voltage shift of the subset of blocks of the individual block family for each die can be used to evaluate and associate each die with a die family of a plurality of consecutive die families. Each die family of the plurality of consecutive die families can be associated with a temporal voltage shift range of a plurality of consecutive temporal voltage shift ranges used to associate each die.

In some embodiments, to determine each temporal voltage shift range of the plurality of consecutive temporal voltage shift ranges, a smallest average temporal voltage shift and a largest average temporal voltage shift among the plurality of average temporal voltage shifts each associated with a die of the plurality of dies are determined. The difference between the largest average temporal voltage shift and the smallest average temporal voltage shift is divided by a number of die families in the plurality of consecutive die families to obtain a range value. Then, the range from largest average temporal voltage shift to the smallest average temporal voltage shift is equally divided based on the range value into a plurality of consecutive temporal voltage shift ranges.

For example, a first consecutive temporal voltage shift range is from the largest temporal voltage shift to the largest temporal voltage shift minus the range value, a second consecutive temporal voltage shift range is from the largest temporal voltage shift minus the range value to the largest temporal voltage shift minus twice the range value, a third consecutive temporal voltage shift range is from the largest temporal voltage shift minus twice the range value to the largest temporal voltage shift minus three times the range value, and so on. Accordingly, each temporal voltage shift range of the plurality of consecutive temporal voltage shift range starting from the first consecutive temporal voltage shift range to the last consecutive temporal voltage shift range is assigned to each die family of the consecutive die families starting with the first die family to the last die family.

Advantages of the present disclosure include, but are not limited to, more accurately and efficiently assigning dies to die families by grouping dies based on similar SCL characteristics during the life cycle of the dies, thereby, improving performance and latency of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells, such as memory array 137. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controller 132 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 132) for media management within the same memory device package. An example of a managed memory device is a managed NAND (MNAND) device.

The memory sub-system 110 includes a die family management component 113 that can . . . . In some embodiments, the memory sub-system controller 115 includes at least a portion of the die family management component 113. In some embodiments, the die family management component 113 is part of the host system 110, an application, or an operating system. In other embodiments, local media controller 135 includes at least a portion of die family management component 113 and is configured to perform the functionality described herein.

Upon each die of a plurality of dies of the memory device 130 and/or 140 reaching a predetermined program erase cycles (PECs), the die family management component 113 may identify a bin of a plurality of bins consecutively number (e.g., bin 0-bin 7) containing at least one or more block families to select a block family of the memory device 130 and/or 140. In some embodiments, the die family management component 113 may proceed upon at least one die of the plurality of dies of the memory device 130 and/or 140 reaching a predetermined PECs. The bin of the plurality of bins may be identified based on a bin with relatively stable charge loss, such as bin 2. The die family management component 113 may select (e.g., identify) a block family from a plurality of block families within the bin. In some embodiments, the die family management component 113 may select the block family from the bin by choosing the youngest block family associated with the bin, the oldest block family associated with the bin, a random block family associated with the bin, or any other suitable method for selecting a representative block family associated with the bin. In some embodiments, the die family management component 113 may choose a block family from the plurality of block families that has the most amount of charge loss.

The die family management component 113 may perform a continuous read level calibration (cRLC) operation on each block of a subset of blocks of the block family located on each die of the plurality of dies. In some embodiments, the subset of blocks may be configurable indicating a minimum number of blocks (e.g., 1 block, 2 blocks, 3 blocks, etc.) and/or the characteristics of the block (e.g., partial block or full block). Accordingly, based on the minimum number of blocks and/or the characteristics, the die family management component 113 may select a block family in accordance with a block family of the plurality of block families in the bin that satisfies the minimum number of blocks and/or the characteristics of the blocks of the block family. Suppose no block families of the bin satisfy the minimum number of blocks and/or the characteristics of the blocks of the block family. In that case, the die family management component 113 delays proceeding until a block family of the bin satisfies the minimum number of blocks and/or the characteristics of the blocks of the block family and/or the next predetermined PEC in which a block family of the bin satisfies the minimum number of blocks and/or the characteristics of the blocks of the block family. In some embodiments, one or more of the cRLC operations may fail, in such event, the die family management component 113 may perform the cRLC operations again or wait until the next predetermined PEC to begin the process again.

Once the die family management component 113 performs the cRLC operations, the die family management component 113 may obtain a temporal voltage shift (e.g., measurement) associated with each block of the subset of blocks for each die of the plurality of dies. The die family management component 113 may average the temporal voltage shift (e.g., measurement) associated with each block of the subset of blocks for each die to generate an average temporal voltage shift (e.g., average measurement) of the respective die. Accordingly, each die of the plurality of dies has a corresponding average measurement. The die family management component 113 may determine a number of die families used to group the plurality of dies. In some embodiments, the plurality of dies have been grouped into a plurality of die families, thus the number of die families to group the plurality dies is determined by the number of existing die families. In some embodiments, the plurality of dies has not been grouped into a plurality of die families. Accordingly, the die family management component 113 may indicate the number of die families used to group the plurality of dies (e.g., 5 die families). Each die family is consecutively number (e.g., die family 0-die family 4).

The die family management component 113 may group (e.g., assign) the dies into a plurality of die families based on the average measurement of each die. To group the dies into the plurality of die families based on the average measurement of each die, the die family management component 113 may assign each die family of the plurality of die families a threshold range indicating a range of average measurements (e.g., average temporal voltage shift) in which an average measurement of a die must fall within to be part of the die family. To assign each die family of the plurality of die families the threshold range, the die family management component 113 may determine a die of the plurality of dies having the largest average measurement and a die of the plurality of dies having the smallest average measurement. The die family management component 113 may divide the range from the largest average measurement to the smallest average measurement into a number of sub-ranges determined by the number of die families used to group the plurality of dies (e.g., 5 sub-ranges).

In some embodiments, the die family management component 113 may assign the sub-ranges one by one to each die family of the plurality of die families consecutively (e.g., starting with die family 0) starting with the range closest to the largest average measurement to the range closest the smallest average measurement. In some embodiments, the die family management component 113 may assign the sub-ranges one by one to each die family of the plurality of die families consecutively (e.g., starting with die family 0) starting with the range closest to the smallest average measurement to the range closest the largest average measurement. In some embodiments, the die family management component 113 may assign the sub-ranges to the plurality of die families in any suitable manner and maintain a data structure reflecting the assignment of each sub-range to each die family.

Further, to group the plurality of dies into the plurality of die families based on the average measurement of each die of the plurality of dies, the die family management component 113 compares the average measurement of each die with each of the sub-ranges. Responsive to satisfying a sub-range, the die family management component 113 determines which die family is associated with the sub-range and assigns the die to the die family associated with the sub-range. As a result, in the event that the die family management component 113 and/or the memory sub-system 115 may wish to update the bins associated with each die of the plurality of dies, a calibration scan can be performed on a single die of each die family in order to evaluate a data state metric (e.g., a bit error rate) and associate each die of the die family to the appropriate bin based on the measurement of the single die of the die family. Further details regarding the operations of the die family management component 113 are described below.

Figure 2:
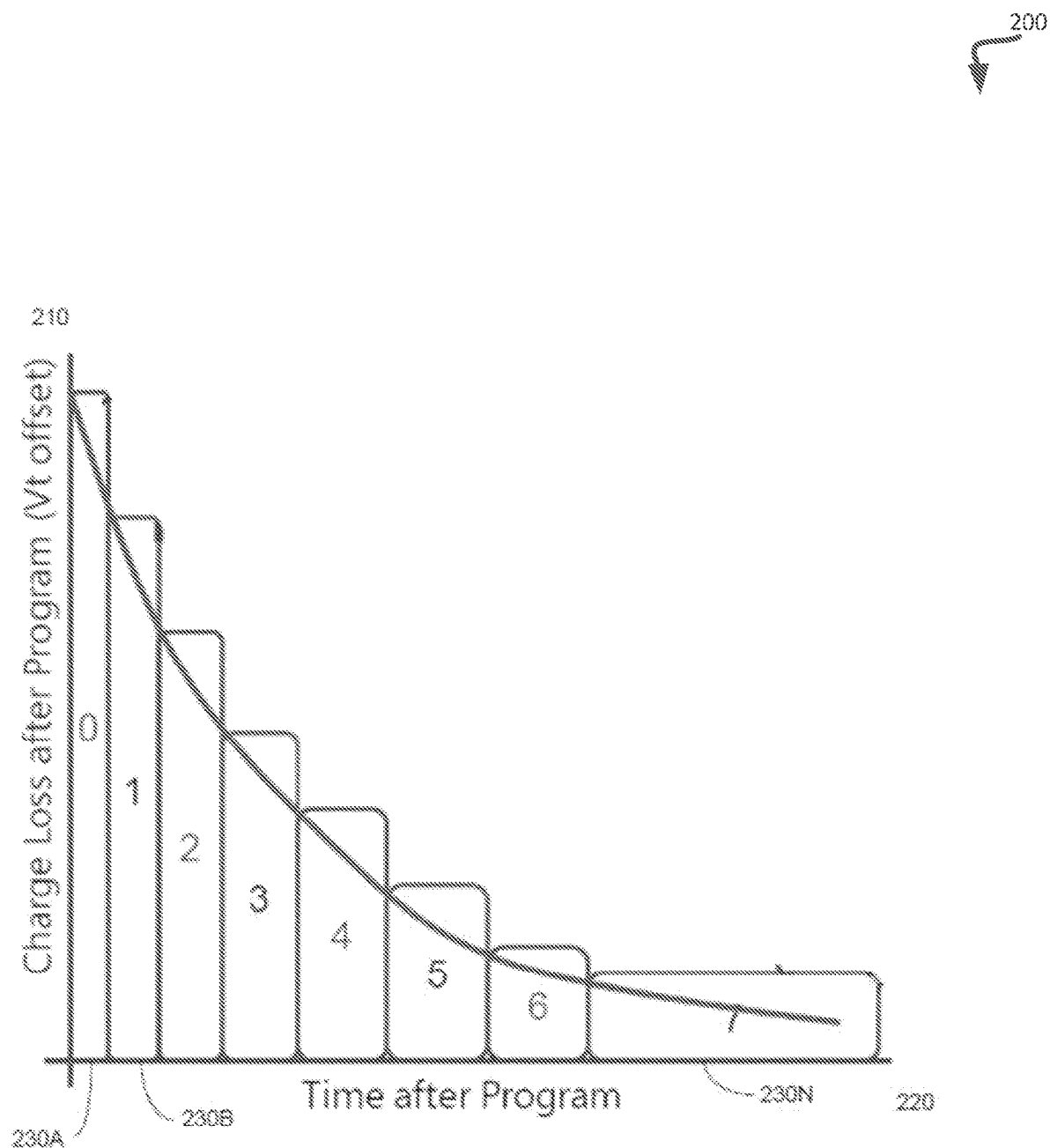
FIG. 2 depicts an example graph illustrating the dependency of the threshold voltage offset on the time after program (i.e., the period of time elapsed since the block had been programmed, in accordance with some embodiments of the present disclosure.

FIG. 2 depicts an example graph 200 illustrating the dependency of the threshold voltage offset 210 on the time after program 220 (i.e., the period of time elapsed since the block had been programmed. As schematically illustrated by FIG. 2, blocks of the memory device are grouped into block families 230A-230N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family 210 are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration process in order to associate each die of every block family with one of the predefines threshold voltage offset bins (bins 0-7 in the illustrative example of FIG. 2), which is in turn associated with the voltage offset to be applied for read operations. The associations of blocks with block families and block families and dies with threshold voltage offset bins can be stored in respective metadata tables maintained by the memory sub-system controller.

Figure 3:
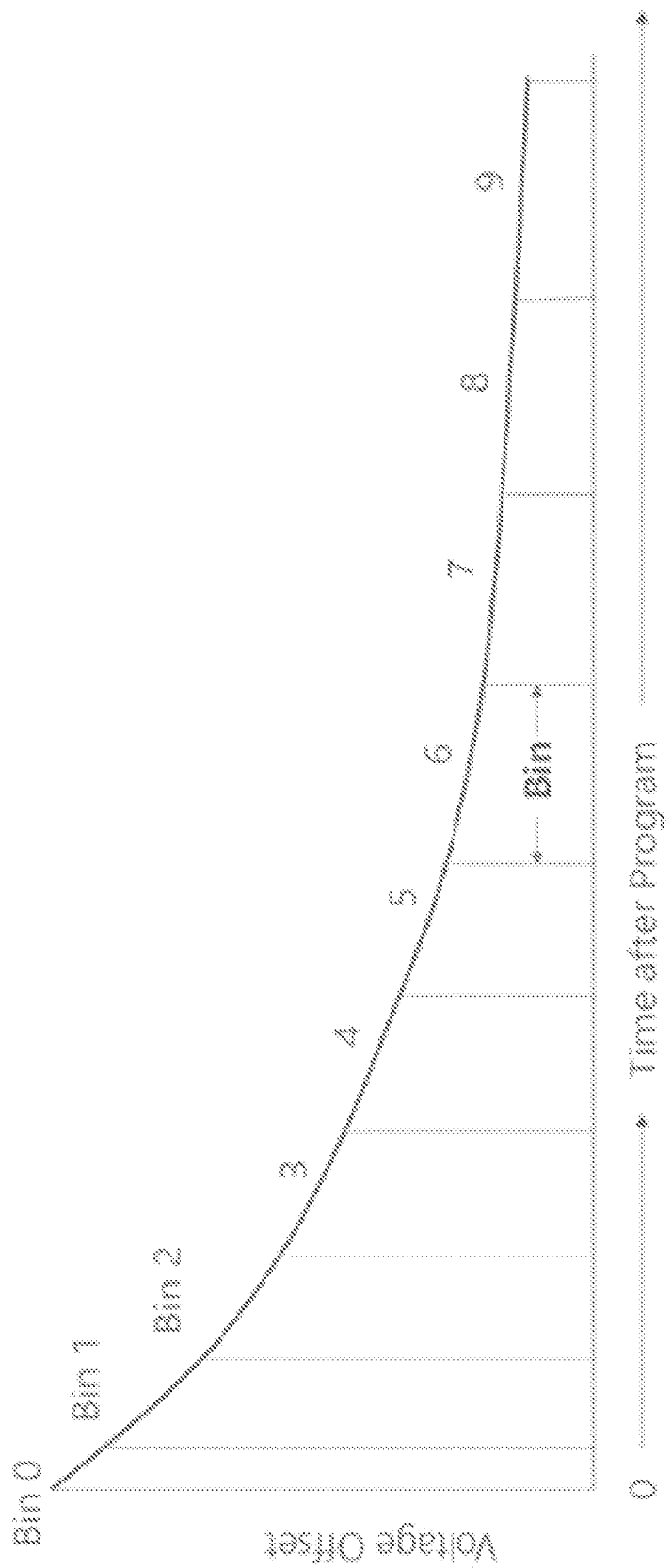
FIG. 3 schematically illustrates a set of predefined threshold voltage offset bins, in accordance with embodiments of the present disclosure.

FIG. 3 schematically illustrates a set of predefined threshold voltage offset bins (bin 0 to bin 9), in accordance with embodiments of the present disclosure. As schematically illustrated by FIG. 3, the threshold voltage offset graph can be subdivided into multiple threshold voltage offset bins, such that each bin corresponds to a predetermined range of threshold voltage offsets. While the illustrative example of FIG. 4 defines ten bins, in other implementations, various other numbers of bins can be employed (e.g., 64 bins). Based on a periodically performed calibration process, the memory sub-system controller associates each die of every block family with a threshold voltage offset bin, which defines a set of threshold voltage offsets to be applied to the base voltage read level in order to perform read operations, as described in more detail herein below.

Figure 4:
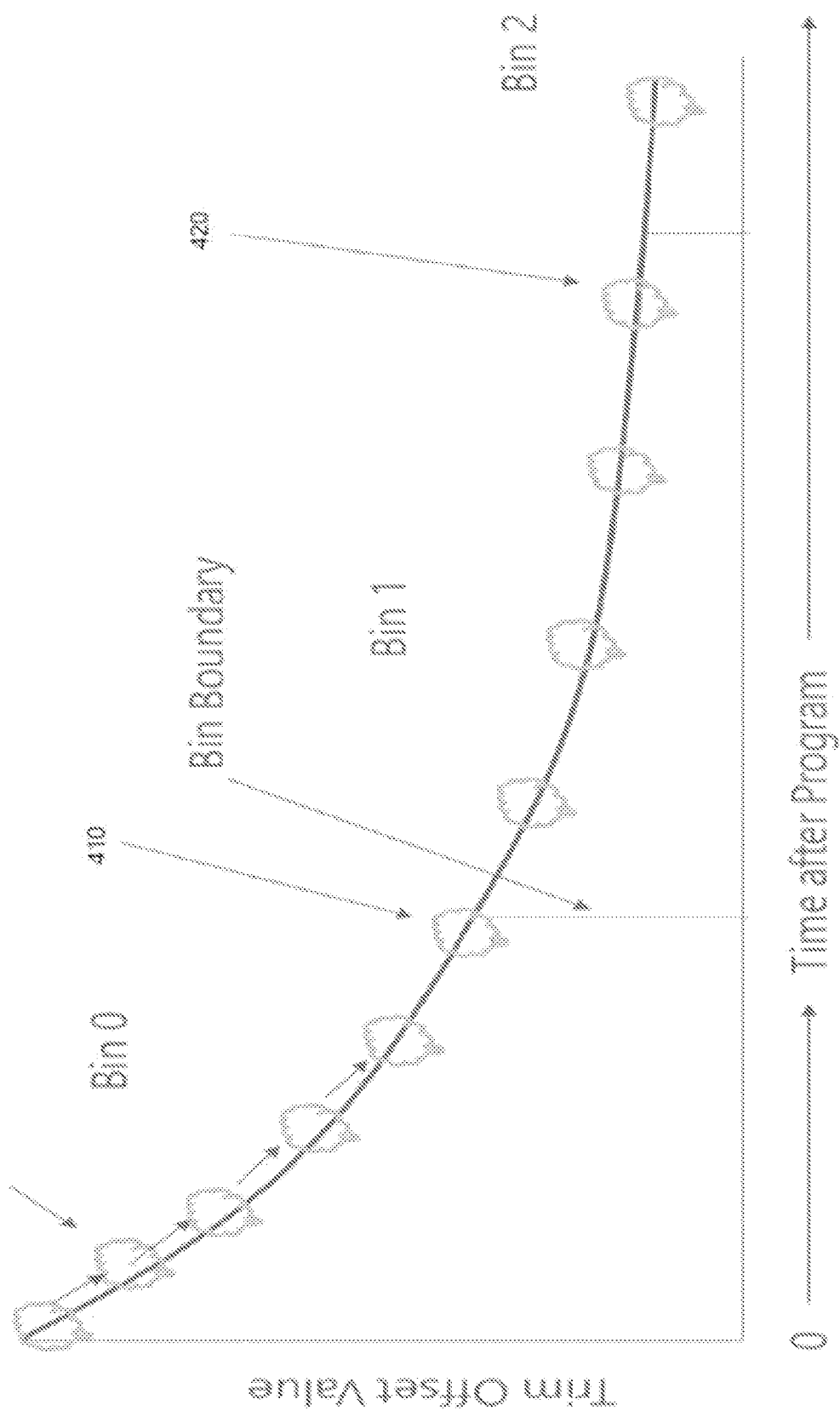
FIG. 4 schematically illustrates selecting block families for calibration, in accordance with embodiments of the present disclosure.

FIG. 4 schematically illustrates selecting block families for calibration, in accordance with embodiments of the present disclosure. As schematically illustrated by FIG. 4, the memory sub-system controller can limit the calibration operations to the oldest block family in each bin (e.g., block family 410 in bin 0 and block family 420 in bin 1), since it is the oldest block family that will, due to the slow charge loss, migrate to the next bin before any other block family of the current bin.

Figure 5:
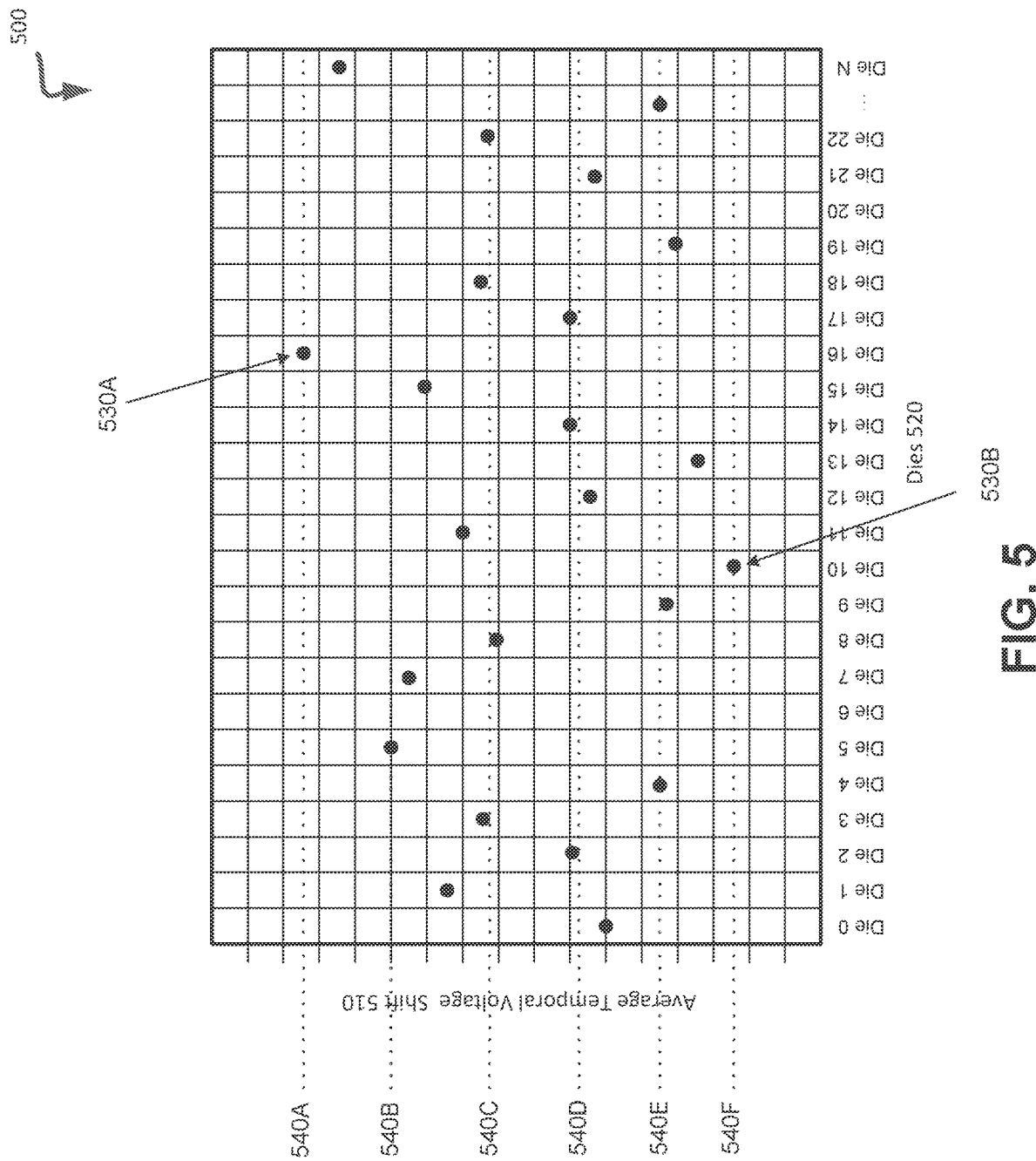
FIG. 5 is a graphical illustration of a temporal voltage shift associated with each die of a plurality of dies used for die family management on a memory device using block family error avoidance, in accordance with embodiments of the present disclosure.

FIG. 5 depicts an example graph 500 illustrating average temporal voltage shifts (e.g., measurement) 510 associated with each die of the plurality of dies 520 (e.g., die 0-die N). As schematically illustrated by FIG. 5, each average measurement associated with the sub-blocks of each respective die is plotted on graph 500. Once each of the average measurement are plotted for each die of the plurality of dies, the die family management component (of FIG. 1), may identify the largest average measurement and the smallest average measurement. For example, average measurement value 530A associated with die 16 of the plurality of dies 520 may be deemed to have the largest average measurement and average measurement value 530B associated with die 10 of the plurality of dies 520 may be deemed to have the smallest average measurement.

The die family management component may equally divide the range from the largest average measurement and the smallest average measurement into a plurality of sub-ranges based on a specified number of die families (e.g., 5 die families). As previously described, the die family management component may determine that the specified number of die families are associated with the number of existing die families or a number of die families needed to group the plurality of dies. The plurality of sub-ranges, for example, include an average measurement value 540A (which is equal to average measurement value 530A indicated as the largest measurement value) to average measurement value 540B, average measurement value 540C to average measurement value 540D, average measurement value 540D to average measurement value 540E, and average measurement value 540E to average measurement value 540F (which is equal to average measurement value 530B indicated as the smallest measurement value). As previously described, each sub-range of the plurality of sub-ranges may be associated with a die family of the plurality of die families, thus each die is assigned to a respective die family based on their corresponding average measurement value falling within the sub-range associated with the respective die family. In some embodiments, falling within the sub-range may include whether the average measurement value is greater than or equal to the sub-range, or whether the average measurement value is less than or equal to the sub-range.

FIG. 6 schematically illustrates a table maintained by the memory sub-system controller for die family management, in accordance with embodiments of the present disclosure. As schematically illustrated by FIG. 5, the memory sub-system controller can maintain the die family table 600. Each record of the die family table 600 specifies a die identity 610 (e.g., die number) and a corresponding die family identity 620 (e.g., die family number).

The die family management component (of FIG. 1) may update die family table 600 based on determining, for each die of the plurality of dies, which sub-range of the plurality of sub-ranges (of FIG. 5) an average measurement of the respective die falls within. Based on determining which sub-range of the plurality of sub-ranges that the average measurement of the respective die falls within, the die family management component updates a record identified by the respective die to indicate that the respective die is assigned to a die family associated with the sub-range that the average measurement of the respective die falls within.

In operation, the die family management may update all dies associated with a die family by querying the die family table 600, determining which dies are associated with a specific die family based on the die family identity 610, and perform an update to each die of the die family. In some embodiments, the die family management may update a bin pointer for each die of the plurality of dies by sampling a die from each die family to obtain an updated bin pointer for each sample die from the plurality of die families. Accordingly, based on the updated bin pointer for each sample die from the plurality of die families, a bin pointer for each die of the respective die family is updated to match a respective sample die of the respective die family.

Figure 7:
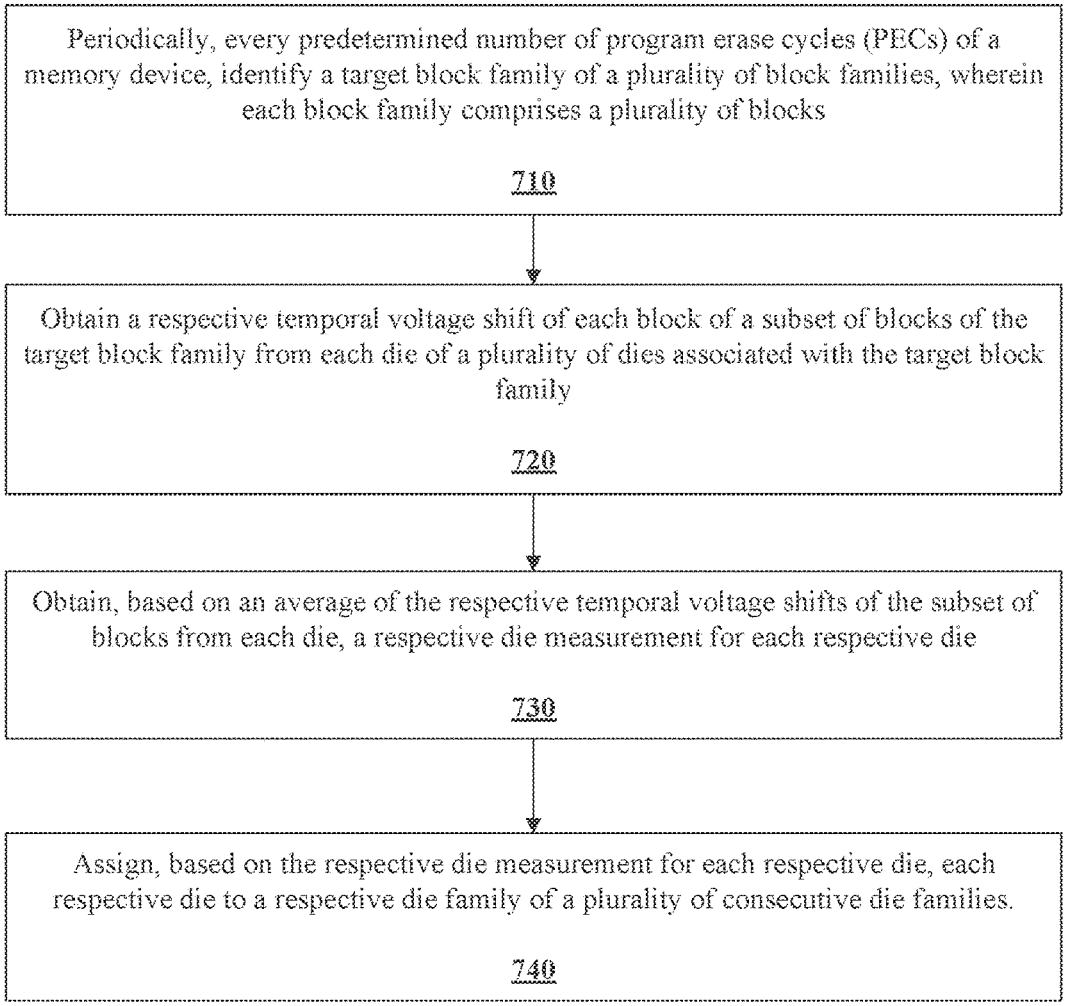
FIG. 7 is a flow diagram of an example method of die family management on a memory device using block family error avoidance, in accordance with some embodiments of the present disclosure.

FIG. 7 is a flow diagram of an example method 700 of die family management on a memory device using block family error avoidance, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by die family management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, responsive to determining that predetermined number of program erase cycles (PECs) of a memory device has occurred, the processing logic identifies a target block family of a plurality of block families of the memory device, wherein each block family comprises a plurality of blocks. Each block family comprises a plurality of blocks. The target block family is a block family of a subset of the plurality of block families that was most recently added to a predetermined bin of a plurality of consecutive bins associated with the memory device. The predetermined bin among the plurality of consecutive bins is configurable.

At operation 720, the processing logic obtains respective temporal voltage shifts of a subset of blocks of the target block family from a plurality of dies associated with the target block family. The subset of blocks of the target block family comprises a predetermined number of full blocks of the plurality of blocks of the target block family. The temporal voltage shift of each block reflects an amount of charge loss from a predetermined read voltage level.

At operation 730, the processing logic obtains, based on an average of the respective temporal voltage shifts of the subset of blocks, respective die measurements for the plurality of dies. At operation 740, the processing logic assigns, based on the respective die measurement for each respective die, each respective die to a respective die family of a plurality of consecutive die families.

In some embodiments, to assign each respective die to the respective die family of the plurality of consecutive die families, for each die family of the plurality of consecutive die families, the processing logic assigns a respective die family a threshold temporal voltage shift range; determining whether a die measurement associated with the respective die satisfies a threshold temporal voltage shift range associated with a die family of the plurality of consecutive die families. Responsive to determining that the die measurement associated with the respective die satisfies the threshold temporal voltage shift range associated with the die family of the plurality of consecutive die families, the processing logic assigns the respective die to the die family.

In some embodiments, to assign the respective die family the threshold temporal voltage shift range, the processing logic determines, among the plurality of dies of the target block family, a die having the largest die measurement and a die having the smallest die measurement. The processing logic obtains a number of die families associated with the plurality of consecutive die families to determine based on the largest die measurement, the smallest die measurement, and the number of die families, a range value. Then the processing logic determines, based on the range value, a plurality of consecutive threshold temporal voltage shift ranges starting with the largest die measurement to the small die measurement and assigns each die family of the plurality of consecutive die families a threshold temporal voltage shift range of the plurality of consecutive threshold temporal voltage shift ranges. The number die families associated with the plurality of consecutive die families is configurable.

Figure 8:
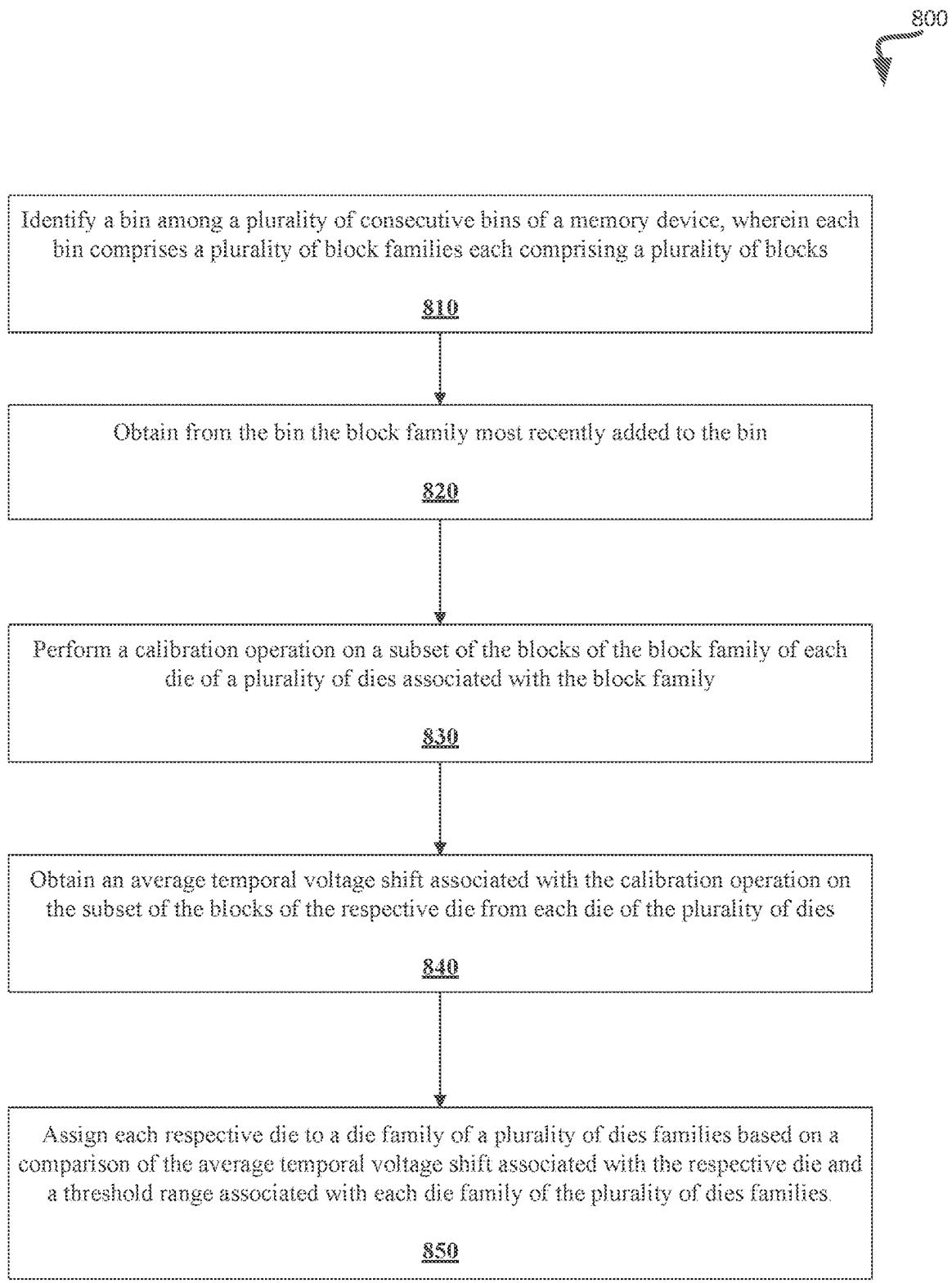
FIG. 8 is a flow diagram of an example method of die family management on a memory device using block family error avoidance, in accordance with some embodiments of the present disclosure.

FIG. 8 is a flow diagram of an example method 800 of die family management on a memory device using block family error avoidance, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by die family management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic identifies a bin among a plurality of consecutive bins of a memory device, wherein each bin comprises a plurality of block families each comprising a plurality of blocks. At operation 820, the processing logic obtains from the bin the block family most recently added to the bin.

At operation 830, the processing logic performs a calibration operation on a subset of the blocks of the block family of each die of a plurality of dies associated with the block family. At operation 840, the processing logic obtains an average temporal voltage shift associated with the calibration operation on the subset of the blocks of the respective die from each die of the plurality of dies.

At operation 850, the processing logic assigns each respective die to a die family of a plurality of dies families based on a comparison of the average temporal voltage shift associated with the respective die and a threshold range associated with each die family of the plurality of dies families.

In some embodiments, to associate the threshold range to each die family of the plurality of dies families, the processing logic determines a die having the largest average data state metric and a die having the smallest average data state metric. The processing logic obtains a number of die families associated with the plurality of die families to determine, based on the largest average temporal voltage shift the smallest average data state metric, and the number of die families, a range value. The processing logic determines, based on the range value, a plurality of consecutive threshold ranges starting with the largest average temporal voltage shift to the small average data state metric. Then the processing logic assigns each die family of the plurality of die families a threshold range of the plurality of consecutive threshold ranges. The number die families associated with the plurality of consecutive die families is configurable.

Depending on the embodiment, each of the proceed operations may be performed by the processing logic periodically every predetermined number of program erase cycles (PECs) of the memory device.

Figure 9:
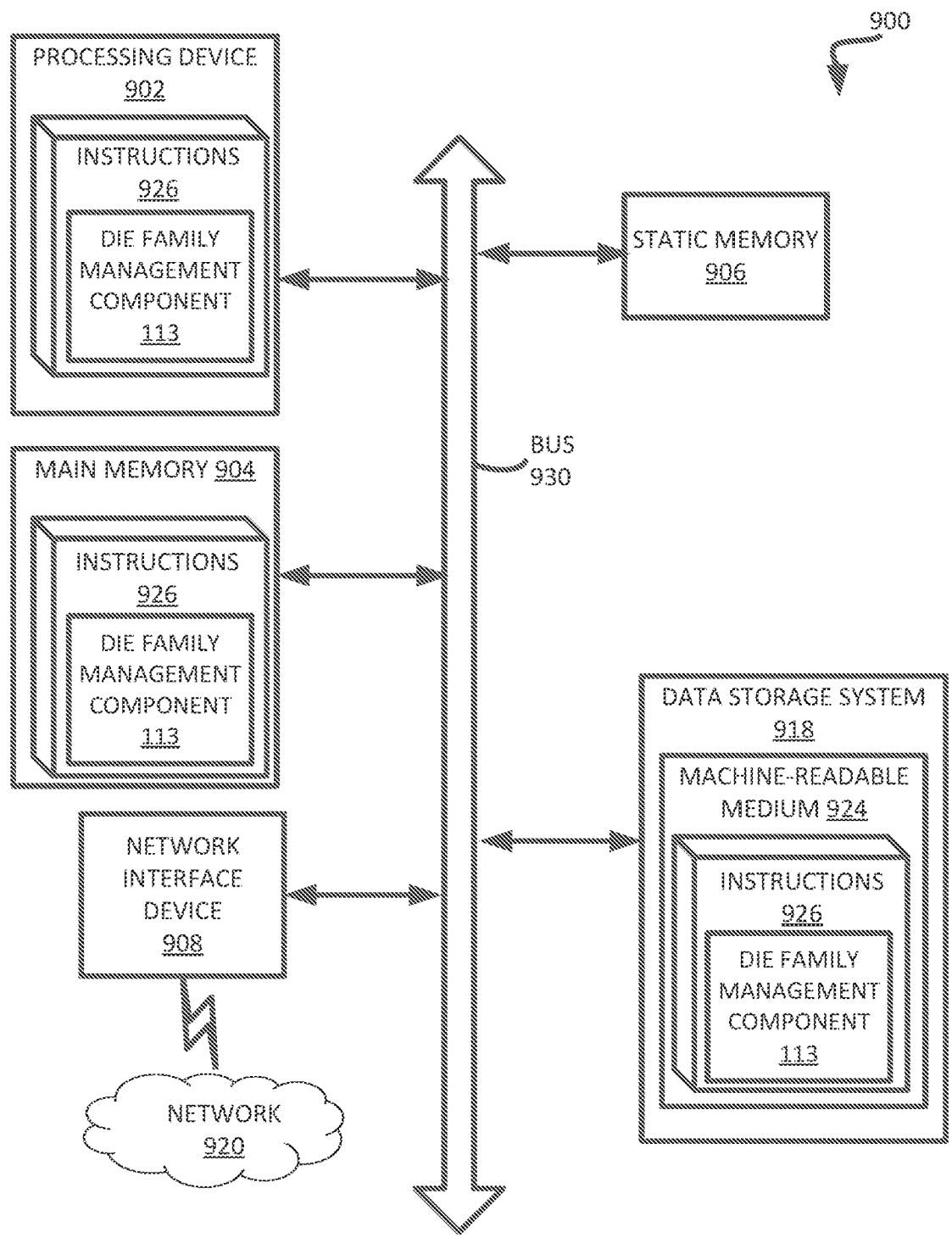
FIG. 9 is a block diagram of an example computer system in which embodiments of the present disclosure may operate.

FIG. 9 illustrates an example machine of a computer system 800 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the die family management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to die family management component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   responsive to determining that predetermined number of program erase cycles (PECs) of a memory device has occurred, identifying a target block family of a plurality of block families of the memory device, wherein each block family comprises a plurality of blocks;
   obtaining respective temporal voltage shifts of a subset of blocks of the target block family from a plurality of dies associated with the target block family;
   obtaining, based on an average of the respective temporal voltage shifts of the subset of blocks, respective die measurements for the plurality of dies; and
   assigning, based on the respective die measurements, the plurality of dies to respective die families of a plurality of consecutive die families.

2. The method of claim 1, wherein the subset of blocks of the target block family comprises a predetermined number of full blocks of the plurality of blocks of the target block family.

3. The method of claim 1, wherein each temporal voltage shift of the temporal voltage shifts reflects an amount of charge loss from a predetermined read voltage level.

4. The method of claim 1, wherein the target block family is a block family of the plurality of block families that was most recently added to a predetermined bin of a plurality of consecutive bins associated with the memory device.

5. The method of claim 4, wherein the predetermined bin among the plurality of consecutive bins is configurable.

6. The method of claim 1, wherein assigning the plurality of dies to respective die families of the plurality of consecutive die families comprises:
   for each die family of the plurality of consecutive die families, assigning a threshold temporal voltage shift range to the respective die family;
   determining whether the respective die measurement associated with the respective die satisfies a threshold temporal voltage shift range associated with a die family of the plurality of consecutive die families; and
   responsive to determining that the die measurement associated with the respective die satisfies the threshold temporal voltage shift range associated with the die family of the plurality of consecutive die families, assigning the respective die to the die family.

7. The method of claim 6, wherein assigning the respective die family the threshold temporal voltage shift range comprises:

determining, among the plurality of dies associated with the target block family, a die having the largest die measurement;

determining, among the plurality of dies associated with the target block family, a die having the smallest die measurement;

obtaining a number of die families associated with the plurality of consecutive die families;

determining, based on the largest die measurement, the smallest die measurement, and the number of die families, a range value;

determining, based on the range value, a plurality of consecutive threshold temporal voltage shift ranges starting with the largest die measurement to the small die measurement; and assigning each die family of the plurality of consecutive die families a threshold temporal voltage shift range of the plurality of consecutive threshold temporal voltage shift ranges.

8. The method of claim 7, wherein the number die families associated with the plurality of consecutive die families is configurable.

9. A system comprising:
a memory device; and
a processing device, operatively coupled to the memory device, the processing device to: responsive to determining that predetermined number of program erase cycles (PECs) of a memory device has occurred, identify a target block family of a plurality of block families of the memory device, wherein each block family comprises a plurality of blocks;
obtain respective temporal voltage shifts of a subset of blocks of the target block family from a plurality of dies associated with the target block family;
obtain, based on an average of the respective temporal voltage shifts of the subset of blocks, respective die measurements for the plurality of dies; and
assign, based on the respective die measurements, the plurality of dies to respective die families of a plurality of consecutive die families.

10. The system of claim 9, wherein the subset of blocks of the target block family comprises a predetermined number of full blocks of the plurality of blocks of the target block family.

11. The system of claim 9, wherein each temporal voltage shift of the temporal voltage shifts reflects an amount of charge loss from a predetermined read voltage level.

12. The system of claim 9, wherein the target block family is a block family of the plurality of block families that was most recently added to a predetermined bin of a plurality of consecutive bins associated with the memory device.

13. The system of claim 12, wherein the predetermined bin among the plurality of consecutive bins is configurable.

14. The system of claim 9, wherein assigning the plurality of dies to respective die families of the plurality of consecutive die families comprises:
for each die family of the plurality of consecutive die families, assigning a threshold temporal voltage shift range to the respective die family;
determining whether the respective die measurement associated with the respective die satisfies a threshold temporal voltage shift range associated with a die family of the plurality of consecutive die families; and
responsive to determining that the die measurement associated with the respective die satisfies the threshold temporal voltage shift range associated with the die family of the plurality of consecutive die families, assigning the respective die to the die family.

15. The system of claim 14, wherein assigning the respective die family the threshold temporal voltage shift range comprises:
determining, among the plurality of dies associated with the target block family, a die having the largest die measurement;
determining, among the plurality of dies associated with the target block family, a die having the smallest die measurement;
obtaining a number of die families associated with the plurality of consecutive die families;
determining, based on the largest die measurement, the smallest die measurement, and the number of die families, a range value;
determining, based on the range value, a plurality of consecutive threshold temporal voltage shift ranges starting with the largest die measurement to the small die measurement; and
assigning each die family of the plurality of consecutive die families a threshold temporal voltage shift range of the plurality of consecutive threshold temporal voltage shift ranges.

16. The system of claim 15, wherein the number die families associated with the plurality of consecutive die families is configurable.

17. A non-transitory computer-readable storage medium comprising instructions that, when executed by a processing device, cause the processing device to perform operations comprising:
identifying a bin among a plurality of consecutive bins of a memory device, wherein each bin comprises a plurality of block families each comprising a plurality of blocks;
obtaining from the bin the block family most recently added to the bin;
performing a calibration operation on a subset of the blocks of the block family of each die of a plurality of dies associated with the block family;
obtaining an average temporal voltage shift associated with the calibration operation on the subset of the blocks of the respective die from each die of the plurality of dies; and
assigning each respective die to a die family of a plurality of dies families based on a comparison of the average temporal voltage shift associated with the respective die and a threshold range associated with each die family of the plurality of dies families.

18. The non-transitory computer-readable storage medium of claim 17, wherein associating the threshold range to each die family of the plurality of dies families comprises:
determining, among the plurality of dies, a die having the largest average data state metric;
determining, among the plurality of dies, a die having the smallest average data state metric;
obtaining a number of die families associated with the plurality of die families;
determining, based on the largest average temporal voltage shift the smallest average data state metric, and the number of die families, a range value;
determining, based on the range value, a plurality of consecutive threshold ranges starting with the largest average temporal voltage shift to the small average data state metric; and assigning each die family of the plurality of die families a threshold range of the plurality of consecutive threshold ranges.

19. The non-transitory computer-readable storage medium of claim 18, wherein number of die families associated with the plurality of die families is configurable.

20. The non-transitory computer-readable storage medium of claim 17, wherein the identifying, the obtaining, the performing, the obtaining, and the assigning is performed periodically every predetermined number of program erase cycles (PECs) of the memory device.

* * * * *